US006372657B1

(12) United States Patent
Hineman et al.

(10) Patent No.: US 6,372,657 B1
(45) Date of Patent: Apr. 16, 2002

(54) METHOD FOR SELECTIVE ETCHING OF OXIDES

(75) Inventors: Max F. Hineman, Boise; Kevin J. Torek, Meridian, both of ID (US)

(73) Assignee: Micron Technology, Inc., Boise, ID (US)

(*) Notice: Subject to any disclaimer, the term of this patent is extended or adjusted under 35 U.S.C. 154(b) by 20 days.

(21) Appl. No.: 09/653,554

(22) Filed: Aug. 31, 2000

(51) Int. Cl.$^7$ ................................................ H01L 21/00
(52) U.S. Cl. ........................ 438/723; 134/1.2; 134/1.3; 156/345; 216/67; 216/69; 216/79; 438/727; 438/743
(58) Field of Search ................................. 438/712, 723, 438/724, 743, 744, 726, 727; 156/345 MW; 134/1.2, 1.3, 2; 216/67, 69, 79

(56) References Cited

U.S. PATENT DOCUMENTS

| 5,030,319 A | | 7/1991 | Nishino et al. | |
| 5,783,495 A | * | 7/1998 | Li et al. | ............ 438/738 |

OTHER PUBLICATIONS

Jun Kikuchi, et al.—"Native Oxide Removal on Si Surfaces by $NF_3$—Added Hydrogen and Water Vapor Plasma Downstream Treatment" Jpn. J. Appl. Phys. vol. 33, Part 1, No. 4B, Apr. 1994, pp. 2207–2211.

H. Nishino, et al.—"Damage–free selective etching of Si native oxides using $NH_3/NF_3$ and $SF_6H_2O$ down–flow etching" Jpn. J. Appl. Phys. vol. 74, No. 2, Jul. 1993, pp. 1345–1348.

* cited by examiner

*Primary Examiner*—William A. Powell
(74) *Attorney, Agent, or Firm*—Dickstein Shapiro Morin & Oshinsky LLP

(57) ABSTRACT

An improved dry plasma cleaning process for the removal of native oxides, or other oxide films or growth residue, from openings formed in an insulating layer provided over a semiconductor substrate, without damaging the substrate or significantly affecting the critical dimension of the opening is disclosed. A mixture of nitrogen trifluoride ($NF_3$), ammonia ($NH_3$) and oxygen ($O_2$) is first injected upstream into a microwave plasma source and is exited, and then the plasma is flowed downstream from the plasma source into a reaction chamber containing the substrate.

25 Claims, 5 Drawing Sheets

METHOD FOR SELECTIVE ETCHING OF OXIDES

FIELD OF THE INVENTION

The present invention relates to the field of semiconductor integrated circuits and, in particular, to a method for selectively etching of oxides.

BACKGROUND OF THE INVENTION

During etching of a contact opening in an insulating layer on a wafer, a native oxide residue, for example silicon dioxide, often remains, particularly at the bottom of the opening. This native oxide residue must be removed before a conductor is deposited in the opening, as the oxide residue will undesirably increase resistance and inhibit current flow through the conductor. The semiconductor surface must also be passivated by hydrogen to further prevent its reoxidation after the removal of the native oxide.

Wet etch cleaning processes have been commonly used for the removal of native oxides and the passivation of the semiconductor surfaces, mainly because wet etches are conventionally used for etching windows in insulating layers, such as silicon dioxide layers. Typically, a buffered oxide etch (BOE) solution containing hydrofluoric acid (HF) is employed for the etching and cleaning of both thermally grown films and deposited $SiO_2$ films. At room temperature, HF etches silicon dioxide much faster than it etches the photoresist or the underlying silicon. The etch rate in BOE ranges from 10 to 100 nm/min at 25° C., depending on the density of the silicon dioxide film. Etch rates also depend on the type of oxide present. As such, silicon dioxide grown in dry oxygen has a slower etch rate than that of the silicon oxide grown in the presence of water. Further, a high concentration of phosphorus in the oxide enhances the etch rate, whereas a high boron concentration reduces the oxide etch rate.

Removal of native oxides, particularly that of silicon dioxide, by a wet chemical cleaning poses two important drawbacks. First, both HF and BOE have poor wetting characteristics on silicon surfaces. As such, conventional wet treatments do not offer reliable processes for cleaning semiconductor surfaces having fine patterns, mainly because viscosity and surface tension of these wet etch solutions prevent, many times, die chemicals from reaching the bottoms of contact openings of such fine patterns. Usually, the native oxide formed at the bottom of an opening with a high aspect ratio (ratio between trench depth and trench diameter) cannot be easily removed by a wet cleaning process simply because surface tension makes it difficult for the etchant to enter the opening.

Second, before the HF/BOE solution reaches the bottom of the openings to remove the native oxides, the sidewalls of die openings tend to be damaged. Thus, in contact hole cleaning at the sub-quarter micron regime uncontrolled increases in tie diameter of the contact holes, known as critical dimension (CD) losses, are common during the wet cleaning process.

FIG. 1 illustrates a contact opening 22 formed according to well-known photolithography processes in an insulating layer 24 of, for example, BPSG that has been applied over a semiconductor substrate 20. In contact opening 22 a bit line conductor (not shown) of for example tungsten (W) will be later formed, as known in the art. As also known in the art, a barrier layer (not shown), formed of a metal such as titanium (Ti) is first applied on surface 21 of tie contact opening 22 prior to the formation of the bit line connector.

Since, as explained above, a native oxide 23 (FIG. 1), such as silicon oxide ($SiO_2$), is formed on the surface 21 of the contact opening 22 during and after its formation, a wet cleaning step is typically performed to remove native oxide 23 prior to the formation of such barrier layer. FIG. 2 shows how removal of the native oxide 23 increases the diameter D of the contact opening 22. This change is illustrated by the change in critical dimension CD, that is, $\Delta CD$ 25 formed as a result of the wet cleaning processes of the prior art.

FIG. 3 exemplifies the time dependency of the change in the critical dimension ($\Delta CD$) for the contact opening 22 of FIG. 1, which undergoes a modified BOE wet etching treatment used in the prior art. As shown in the graph of FIG. 3, the BOE treatment gives an increase in CD because it etches the adjacent insulating layer 24 (FIG. 1). For example, even for a low dipping time, such as $t_1$ of approximately 25 seconds, the change in the critical dimension $\Delta CD_1$ is high, of about 180 Angstroms. This increase in the diameter of the contact opening 22 also impacts the displacement of the metal atoms that fill the contact opening. Thus, in addition to the loss in critical dimension and penetration uniformity, electrical contacts may also become unreliable.

To overcome the problems associated with wet cleaning of native oxides in contact holes, the semiconductor industry has begun using dry etch processes, such as a plasma etch or ion-assisted etch, which are largely anisotropic and unidirectional. Several attempts have been made to remove native oxides, in particular silicon oxide ($SiO_2$), from their corresponding contact openings. For example, Nishino et al. teach a method for the removal of native oxides from silicon surfaces by an $NF_3$ and $NH_3$ plasma downstream treatment (J. Appl. Phys. Vol. 74, No. 2, Jul. 15, 1993). Similarly, Iusuki et al. report the native oxide removal by dry processing using $NF_3$ and $H_2$ plasma downstream treatment (Jap. J. Appl. Phys. Vol. 33, No. 4B, April 1994).

Accordingly, there is a need for an improved dry plasma etching technique which provides a substantially uniform etch in a contact opening without an increase in the critical dimension and without striations formed in the sidewalls of such contact opening. There is also a need for a dry plasma etching process for removal of native oxides from openings with less damage to the sidewalls of the opening. There is further a need for an improved dry plasma etching method for etching undoped oxide, such as thermally grown $SiO_2$, faster than doped oxide, such as BPSG.

SUMMARY OF THE INVENTION

The present invention provides a dry plasma cleaning process for the removal of native oxides, or other oxide films or growth residue, formed on a semiconductor substrate, without damaging the substrate or affecting the critical dimension of a pattern on such substrate and with less damage to a downstream processing chamber. The invention is particularly useful for the selective etching of silicon dioxide residue at the bottom of a contact opening which is formed in a BPSG doped insulating layer. The invention is also useful for the etching of undoped oxides, such as thermally grown $SiO_2$, at a faster rate than that for doped oxides, such as BPSG.

The present invention uses a gaseous mixture of nitrogen trifluoride ($NF_3$) and ammonia ($NH_3$), which is first injected upstream into a microwave plasma source which excites them, and then both gases flow downstream in plasma form onto a substrate surface. The method of the present invention provides a dry cleaning process for damageless removal of native oxides and/or growth residue from the bottom of a contact opening, without significantly affecting the critical dimension of such contact opening and with less damage to a downstream processing chamber. The invention also provides a dry plasma technique for etching undoped oxides faster than doped oxides.

The foregoing and other advantages and features of the invention will be better understood from die following detailed description of the invention, which is provided in connection with the accompanying drawings.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made.

The term "substrate" used in the following description may include any semiconductor-based structure. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a substrate in the following description, previous process steps may have been utilized to form regions or junctions in or on the base semiconductor or foundation.

The term "part" is used to indicate one of several equal units of which the gaseous mixtures used in the present invention are comprised. Because all gases are used at identical pressures and temperatures, the term part is used instead of other terminology (for example, moles) to underscore the importance of using gases mi particular ratios as opposed to in particular amounts.

The present invention provides a plasma etching and cleaning process for the removal of native oxides, or other oxide films or growth residue, formed over a substrate, without damaging the substrate or affecting the critical dimension of a pattern formed over such substrate. The invention also provides a method for achieving a faster etching rate for undoped oxides, as opposed to doped oxides. The invention is particularly useful in removing native oxides from the bottom of contact openings etched in an insulating layer formed over a substrate.

The present invention uses a mixture of nitrogen trifluoride ($NF_3$) and ammonia ($NH_3$) gases, which is injected upstream into a microwave plasma source which excites them, and then the upstream plasma flows downstream in a plasma form onto the substrate surface.

Figure 4:
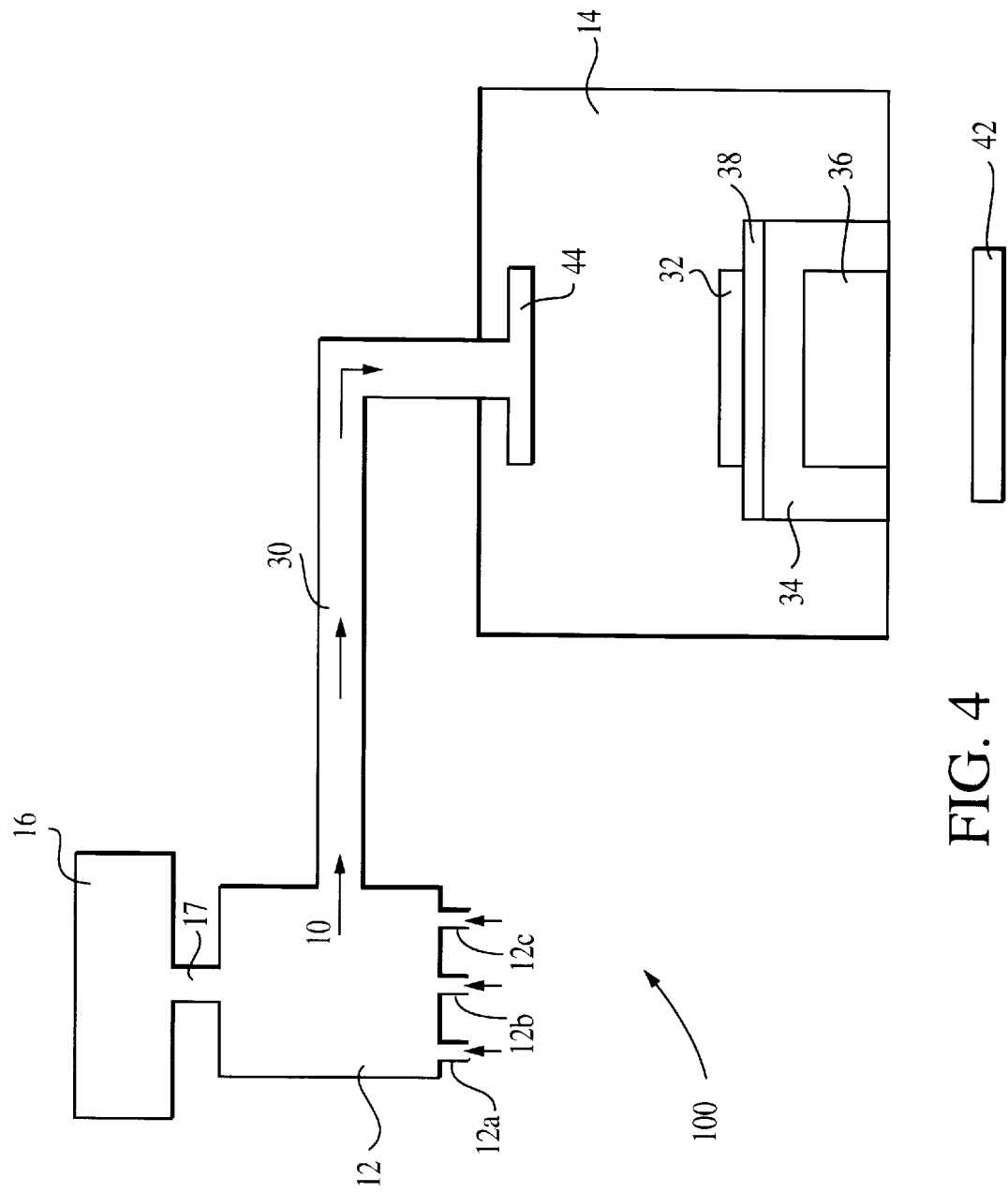
FIG. 4 is a schematic view of the fusion plasma reactor apparatus used in the present invention.

Referring now to the figures, where like elements are designated by like reference numerals, FIG. 4 shows a schematic view of apparatus 100 employed in die present invention. A plasma source chamber 12 is remotely positioned from a reaction chamber 14. The plasma source chamber 12 excites a gaseous mixture 10 into a plasma prior to the transport of the gaseous mixture to the reaction chamber 14, through a conduit 30 (FIG. 4). FIG. 4 also shows a substrate 32 located on a substrate stage or table 34, which supports the substrate 32 through a chuck 38, which mechanically or electrostatically holds the substrate 32 to table 34. The substrate table 34 is also provided with a cooling device 36 which cools the substrate table 34. A heating lamp 42 located on die outside of the reaction chamber 14 maintains die temperature of the substrate 32 constant and also helps reduce the amount of residue that is eventually formed on the walls of die reaction chamber 14.

As also shown in FIG. 4, the plasma apparatus 100 is also provided with a microwave cavity 16, which is connected to the plasma source chamber 12 through a wave inlet 17. Microwaves at, for example, 2.45 GHz are generated in the cavity 16 and applied through the wave inlet 17 to the plasma source chamber 12. Further illustrated in FIG. 4 are gas inlets 12a, 12b, and 12c, through which suitable etching gases may be introduced in the source chamber 12 in accordance with the present invention. The microwave cavity 16, the wave inlet 17, die reaction chamber 14, the plasma source chamber 12, and the conduit 30 are formed of quartz or, more preferably, of saphire.

A selective etching and cleaning method for native oxides, such as $SiO_2$, from the bottoms of contact openings etched into a BPSG insulating layer is explained below using the apparatus 100 of FIG. 4. The apparatus 100 of FIG. 4 may be also used, in general, for etclhing undoped oxides faster than doped oxides. According to an exemplary embodiment, the etching process of the present invention is carried out in the reaction chamber 14, which is a high density plasma (HDP) etcher. A cleaning etch is a reactive ion etch, which is a combination of chemical plasma etching, in which a plasma etches by chemically reacting with the substrate, and ion beam etching, which is a physical process using high energy ions to bombard die substrate in order to etch it.

The fusion plasma of the present invention, used for selectively etching and cleaning of native oxides, includes a gaseous mixture 10 of nitrogen trifluoride ($NF_3$) and ammonia ($NH_3$). Both gases are first injected through their respective gas inlets 12a, 12b (FIG. 4) into the plasma source chamber 12. A microwave, typically of 2.45 GHz at 500 W, housed within the microwave cavity 16, is excited and the resulting microwave is applied through the wave inlet 17 to tie plasma source chamber 12 containing the $NH_3/NF_3$ gaseous mixture 10. As a result, a discharge is generated inside die plasma source chamber 12 and die gases forming the $NH_3/NF_3$ gaseous mixture 10 are decomposed. Thus, before tie downstream treatment, both $NF_3$ and $NH_3$ gases are first injected upstream, and only then do both flow downstream as a plasma from tie plasma source chamber 12, to the reaction chamber 14 onto the surface of the substrate 32.

According to an exemplary embodiment, the plasma etching process of the present invention uses the two etching gases ammonia ($NH_3$) and nitrogen trifluoride ($NF_3$) injected into the plasma source chamber 12 at a rate of approximately 1000–4000 standard cubic centimeters per minute (sccm) for $NH_3$, and a rate of approximately 25–200 standard cubic centimeters per minute (sccm) for $NF_3$. Oxygen ($O_2$) may also be injected with the $NH_3/NF_3$ gaseous mixture 10, at a rate of approximately 50–1000 standard cubic centimeters per minute (sccm), so that final gas mixture comprises between 2% to about 10%, more preferably of about 5%, oxygen. The addition of oxygen to the fusion plasma elevates the $H^+$ radical concentration, which helps achieve a desired selectivity.

Next, the $NH_3/NF_3/O_2$ gaseous mixture 10 flows downstream, through the conduit 30 (FIG. 4), into a diffuser 44 situated inside the reaction chamber 14, and onto the sample substrate 32.

Examples of implementation of die invention will now be described with reference to FIGS. 1, 4, 5 and 6. In each of the two sets of experiments which will be described in more detail below, the critical dimension (CD) bias of contact openings, such as contact opening 22 of FIG. 1, which underwent a dry plasma etching with the $NH_3/NF_3/O_2$ gaseous mixture 10 of the present invention was measured.

In addition, the etching depths of thermally grown oxides, which are undoped oxides, and of boron-phosphosilicate glass (BPSG) oxide, which is a doped oxide, were measured and compared after etching with the $NH_3/NF_3/O_2$ gaseous mixture 10.

First Set of Experiments

Under a first set of experiments, which is described below with reference to FIG. 5, a first silicon substrate 32a, with contact opening 22 (FIG. 1) formed into a BPSG layer of approximately 1500 Angstroms, was selectively etched with seven different etch chemistries in accordance with the present invention, to allow for the removal of any native oxide from the bottom of the contact opening 22. The seven etch chemistries of the present invention are represented by process parameters corresponding to points P1 to P7 of FIG. 5, and they will be described in more detail below. The silicon substrate 32a was initially patterned by a conventional dry etch and resist strip, as well-known in the art, to form contact opening 22 into the BPSG layer having an approximately $0.3\mu$ diameter and an approximately $1.5\mu$ depth.

As also part of the first set of experiments, a downstream treatment with the $NH_3/NF_3/O_2$ gaseous mixture 10 of the present invention was performed on two different insulating layers, thermally grown $SiO_2$ and BPSG, respectively. The effects on both insulating materials for the seven different dry etch chemistries, corresponding to points P1 to P7 of FIG. 5, of the present invention were measured and compared. Prior to the selective etching treatment with the gaseous mixture of the present invention, a thermally grown oxide film of $SiO_2$ was formed to approximately 1000 Angstroms by dry oxidation at elevated temperatures, for example 900° C., on a second silicon substrate 32b. Similarly, on a separate and third silicon substrate 32c, a boron-phosphosilicate glass (BPSG) film was grown to approximately 8000 Angstroms and was doped with boron and phosphorus with 3.1 wt % and 6.5 wt %, respectively.

Next, all three silicon substrates 32a, 32b, and 32c were individually contacted with the $NH_3/NF_3/O_2$ gaseous mixture 10 and the change in the critical dimension (CD) for the contact opening 22, as well as the etching depths for thermally grown $SiO_2$ and BPSG, were individually recorded. All three substrates 32a, 32b, 32c were separately contacted with the $NH_3/NF_3/O_2$ gaseous mixture under the following conditions and ranges of flow rates:

| | |
|---|---|
| Pressure: | 1.5 Torr |
| RF Power: | 1000 Watts |
| Magnetic Field: | 0 Gauss |
| Time: | 60 Seconds |
| Gas Flows: | |
| $NH_3$ | 1000–4000 sccm |
| $NF_3$ | 50–200 sccm |
| $O_2$ | 25–1000 sccm |

Figure 5:
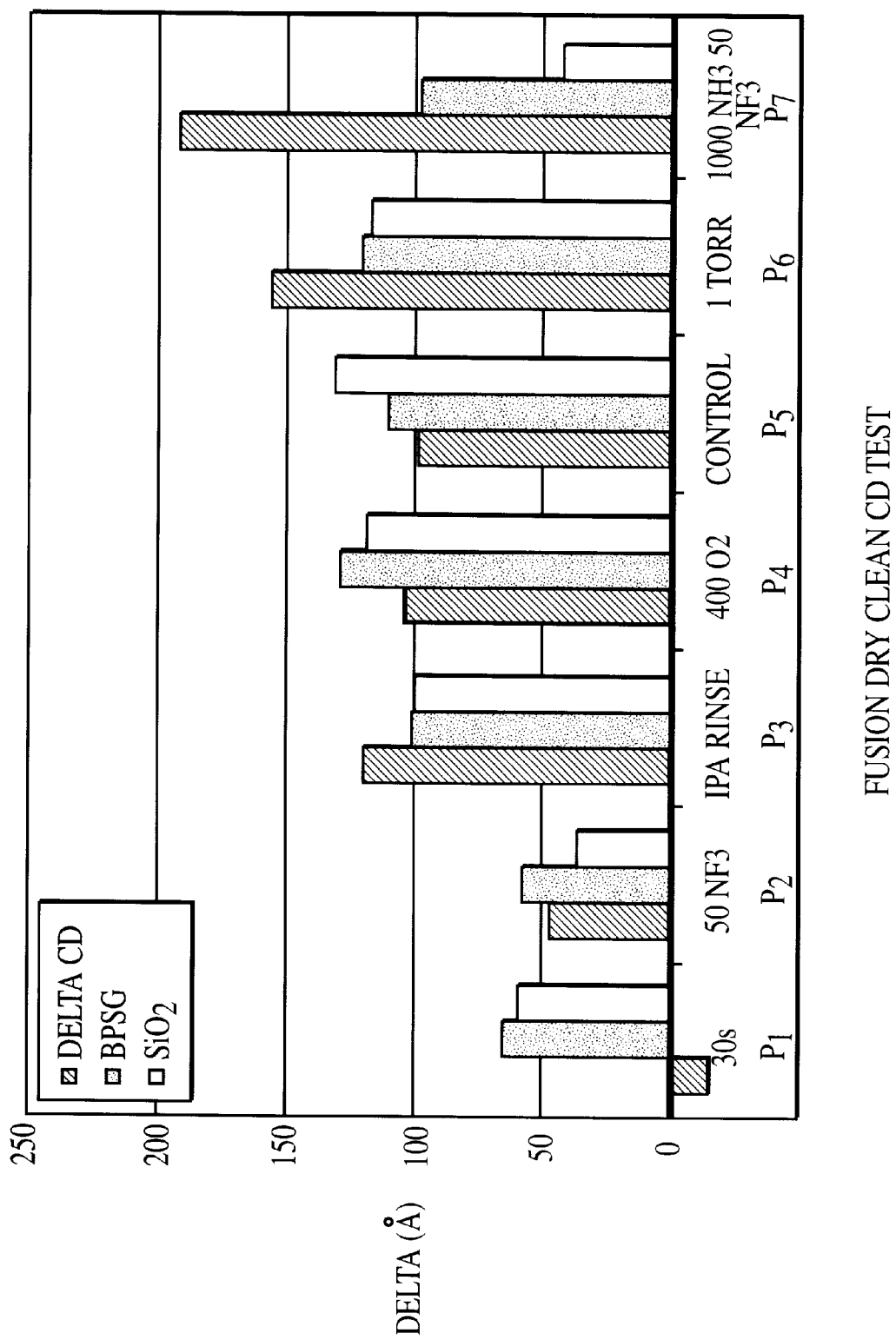
FIG. 5 shows the etching depths for thermally grown $SiO_2$ and BPSG insulators and the change in the critical dimension of a contact opening which undergo different etching treatments according to a method of the present invention.

More specifically, seven different experiments were run for different etching parameters of the $NH_3/NF_3/O_2$ gaseous mixture 10 of the present invention, and die data from each experiment was recorded and illustrated in FIG. 5, where the change in tie critical dimension, $\Delta CD$, of the contact opening 22, and the etching rates of thermally grown $SiO_2$ and BPSG are illustrated as a function of different etching parameters.

For example, all three silicon substrates 32a, 32b, and 32c were individually contacted with tie $NH_3/NF_3/O_2$ gaseous mixture 10 under the process conditions of P1 (FIG. 5), which are as follows:

| | |
|---|---|
| Pressure: | 1.5 Torr |
| RF Power: | 1000 Watts |
| Magnetic Field: | 0 Gauss |
| Time: | 30 Seconds |
| Gas Flows: | |
| $NH_3$ | 2000 sccm |
| $NF_3$ | 100 sccm |
| $O_2$ | 100 sccm |

All three silicon substrates 32a, 32b, and 32c were also individually contacted with the $NH_3/NF_3/O_2$ gaseous mixture 10 under the following P2 process parameters:

| | |
|---|---|
| Pressure: | 1.5 Torr |
| RF Power: | 1000 Watts |
| Magnetic Field: | 0 Gauss |
| Time: | 60 Seconds |
| Gas Flows: | |
| $NH_3$ | 2000 sccm |
| $NF_3$ | 50 sccm |
| $O_2$ | 100 sccm |

Next, an IPA rinse was performed (P3 of FIG. 5) on all three substrates, after which all three substrates were individually contacted with the $NH_3/NF_3/O_2$ gaseous mixture 10 under process parameters P4 of FIG. 5:

| | |
|---|---|
| Pressure: | 1.5 Torr |
| RF Power: | 1000 Watts |
| Magnetic Field: | 0 Gauss |
| Time: | 60 Seconds |
| Gas Flows: | |
| $NH_3$ | 2000 sccm |
| $NF_3$ | 50 sccm |
| $O_2$ | 400 sccm |

Under the control process conditions of P5, the gas ratio of $NH_3$, $NF_3$, and $O_2$ was set to 200:10:10:

| | |
|---|---|
| Pressure: | 1.5 Torr |
| RF Power: | 1000 Watts |
| Magnetic Field: | 0 Gauss |
| Time: | 60 Seconds |
| Gas Flows: | |
| $NH_3$ | 2000 sccm |
| $NF_3$ | 100 sccm |
| $O_2$ | 100 sccm |

P6 reflects the changes in all three silicon substrates 32a, 32b, and 32c, which were individually contacted with the $NH_3/NF_3/O_2$ gaseous mixture 10 under the following conditions:

| | |
|---|---|
| Pressure: | 1 Torr |
| RF Power: | 1000 Watts |
| Magnetic Field: | 0 Gauss |
| Time: | 60 Seconds |
| Gas Flows: | |
| $NH_3$ | 2000 sccm |
| $NF_3$ | 100 sccm |
| $O_2$ | 100 sccm |

Finally, all three silicon substrates 32a, 32b, and 32c were individually contacted with the $NH_3/NF_3/O_2$ gaseous mixture 10 under the following conditions corresponding to P7 of FIG. 5:

| | |
|---|---|
| Pressure: | 1.5 Torr |
| RF Power: | 1000 Watts |
| Magnetic Field: | 0 Gauss |
| Time: | 60 Seconds |
| Gas Flows: | |
| $NH_3$ | 1000 sccm |
| $NF_3$ | 50 sccm |
| $O_2$ | 100 sccm |

The results of the first set of experiments show that, under the control conditions (P5 of FIG. 5), the etching depth for thermally grown $SiO_2$ exceeded that for BPSG (140 Angstroms as opposed to 110 Angstroms). FIG. 5 also shows that, under all other process conditions of the first set of experiments, the etching depth for thermally grown $SiO_2$ was about equal to, or slightly lower than, that for BPSG.

The highest increase in the critical dimension, of about 200 Angstroms, occurred under $NH_3/NF_3/O_2$ gas flow ratio 100:5:10 (P7 of FIG. 5), while the smallest change in the critical dimension, of less than 50 Angstroms, occurred under $NH_3/NF_3/O_2$ gas flow ratio 200:5:10 (P2 of FIG. 5).

Thus, according to the results of the first set of experiments illustrated in FIG. 5, the best results for the change in the critical dimension were obtained when the experiment was carried out under the process conditions of P2, that is $NH_3/NF_3/O_2$ gaseous mixture at volume ratio 200:5:10 with a reduced amount of nitrogen trifluoride relative to the amount of ammonia.

To further exemplify the improved etching and cleaning characteristics of the fusion plasma employing the $NH_3/NF_3/O_2$ gaseous mixture of the present invention, reference is now made to a second set of experiments, which will be explained in conjunction with FIG. 6.

Second Set of Experiments

Figure 1:
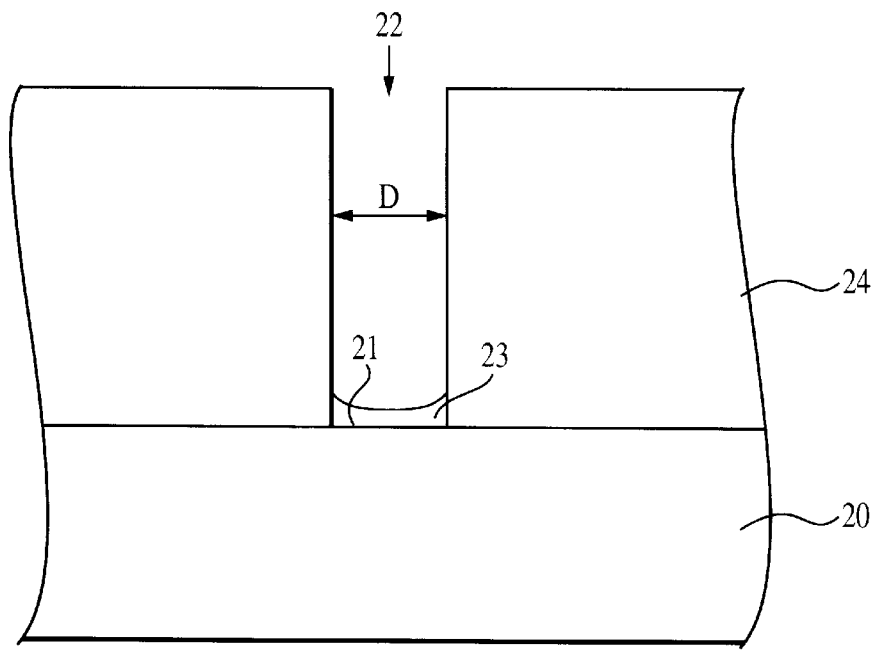
FIG. 1 is a schematic cross-sectional view of a portion of a representative semiconductor substrate with a conventional contact opening formed in an insulating layer accordance with the prior art.
Figure 2:
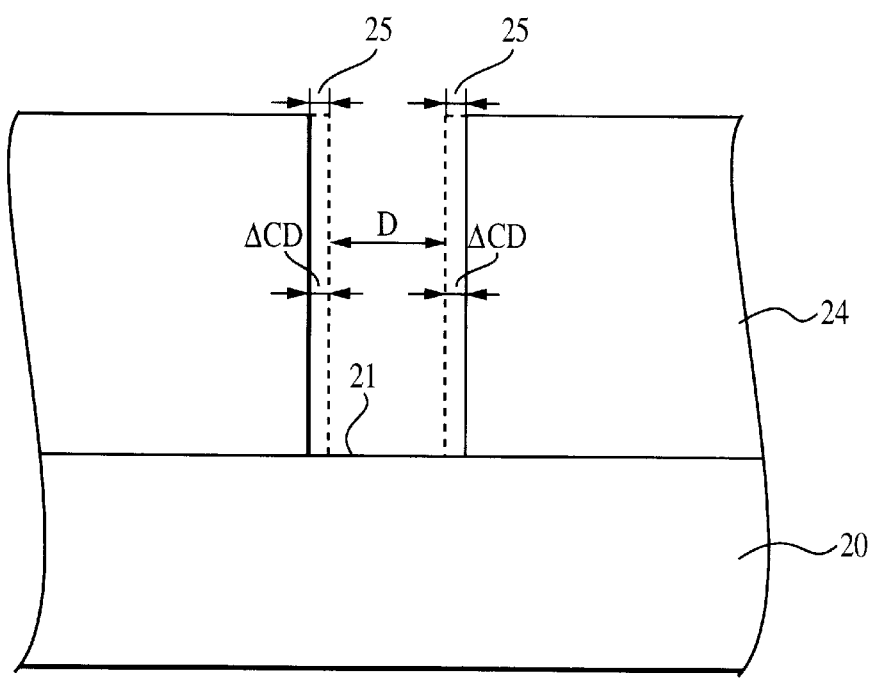
FIG. 2 depicts the loss in critical dimension of the contact opening of FIG. 1 when it undergoes a wet cleaning treatment in accordance with the prior art.
Figure 3:
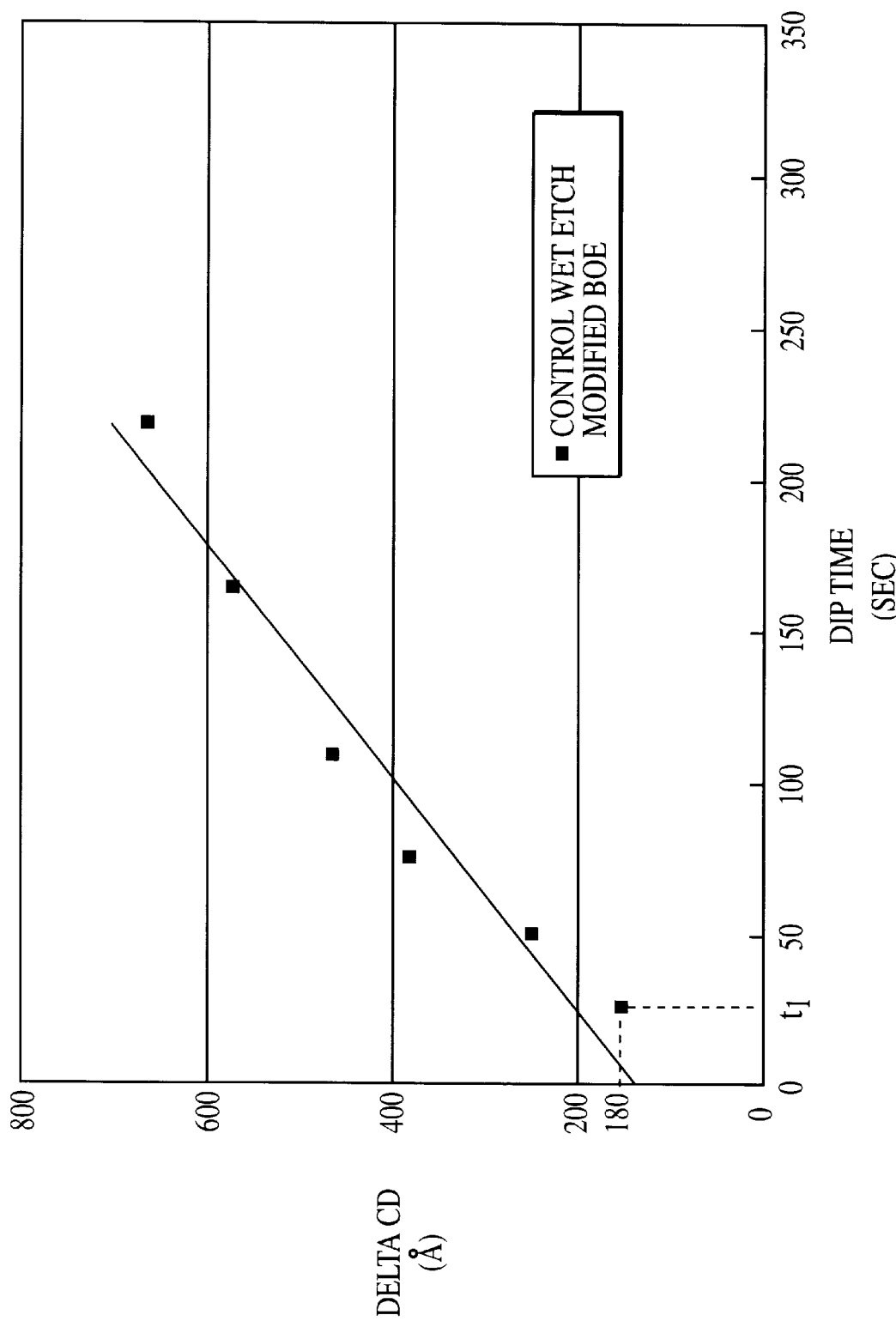
FIG. 3 is a graph illustrating the time dependency of changes in the critical dimension of the contact opening of FIG. 1 when it undergoes an etching treatment in accordance with the prior art.

Under the second set of experiments, a contact opening, such as contact opening 22 of FIG. 1, formed on a structure substrate, such as silicon substrate 32a, underwent etching under two different etching chemistries for two different aspect ratios, that is 0.5 nominal and 0.6 nominal, respectively. For each of the two chemistries, the change in critical dimension was recorded, as shown in FIG. 6. Out of the two etching chemistries, one was a conventional wet etching chemistry (illustrated at point E1 of FIG. 6) and the other one was a dry etching chemistry in accordance with the present invention (illustrated at point E2 of FIG. 6).

Figure 6:
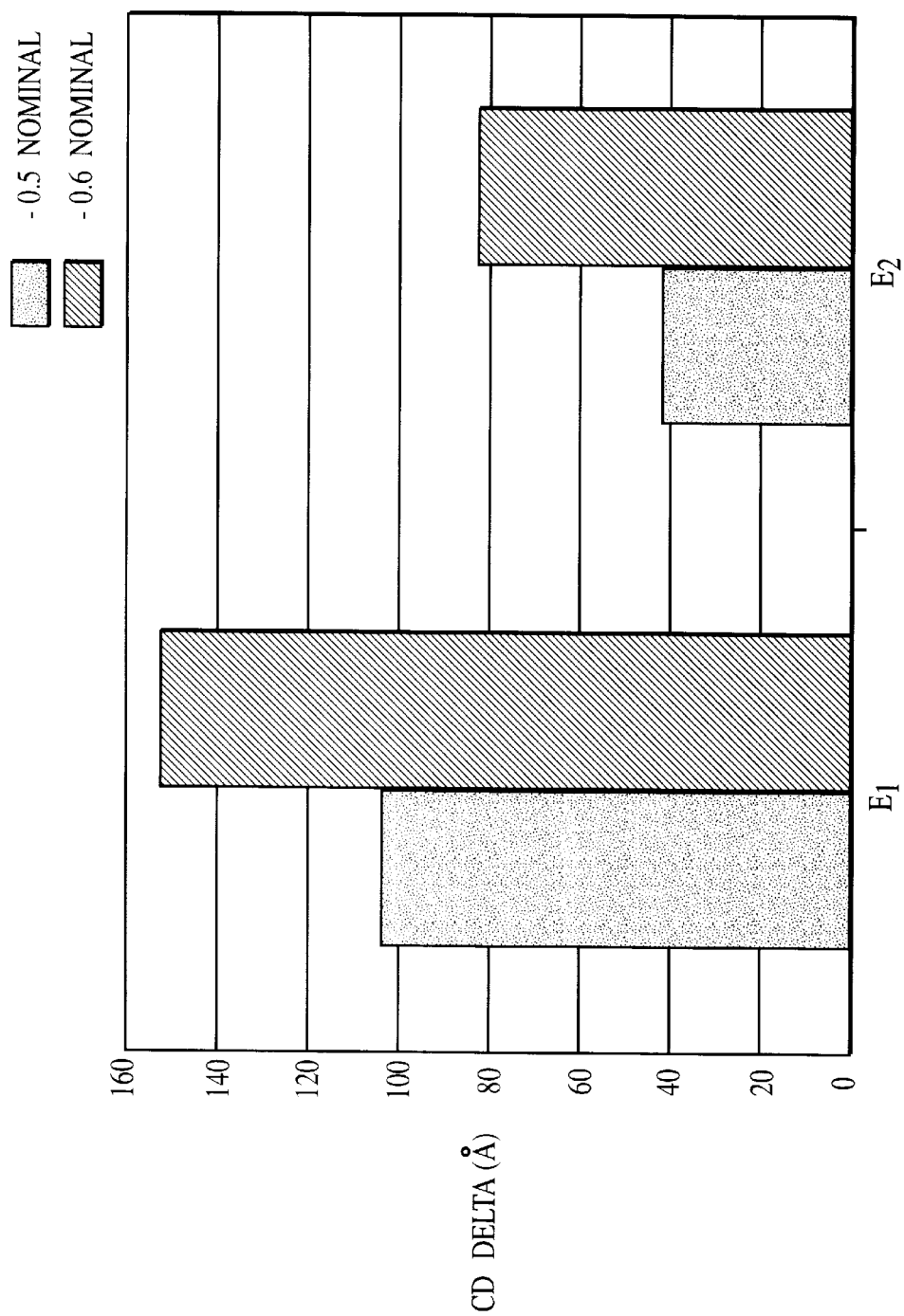
FIG. 6 shows a comparison of the change in critical dimension of a contact opening formed using etching treatments according to a method of the prior art and according to a method of the present invention.

As illustrated in FIG. 6, the change in critical dimension was recorded and measured for the conventional wet etch modified BOE chemistry (exemplified at E1). Also illustrated in FIG. 6, and by comparison to the wet etch chemistry, the change in critical dimension (CD) bias of the contact opening 22 of the substrate 32a was also recorded and measured for one of the dry plasma etching chemistries of the present invention, under the process conditions $NH_3/NF_3/O_2$ gaseous mixture at volume ratio 200:5:10 under 60 seconds (exemplified at E2).

As in the first set of examples, the contact opening 22 was formed on the substrate 32a by etching a BPSG insulating layer of approximately 1500 Angstroms. The contact opening 22 was initially of about $0.3\mu$ in diameter and about 1.5 $\mu$ in depth. After contact opening 22 was etched with the two different chemistries, the change in the critical dimension for both chemistries were measured and the data plotted in FIG. 6.

According to the CD measurements of FIG. 6, etching with the $NF_3/NH_3/O_2$ gaseous mixture 10 at point E2 ($NH_3/NF_3/O_2$ at volume ratio 200:5:10) gives a much smaller change in the critical dimension ($\Delta$CD) of the contact opening 22 than etching with die conventional modified BOE chemistry. For the preferred chemistry of the present invention at point E2 ($NH_3/NF_3/O_2$ gaseous mixture at volume ratio 200:5:10), the CD measurements show a change in the critical dimension of less than 50 Angstroms for 0.5 nominal aspect ratio, and of about 80 Angstroms for 0.6 nominal aspect ratio. The CD measurements also show a substantial increase in the critical dimension, of approximately 150 Angstroms, at point E1, which corresponds to the conventional wet etch modified BOE chemistry of the prior art.

The results and measurements of the present invention confirm that the mixture of two gases, nitrogen fluoride ($NF_3$) and ammonia ($NH_3$) which are injected upstream into a microwave plasma source, with a small amount of oxygen ($O_2$) and a reduced amount of nitrogen trifluoride, provides an improved etching and dry cleaning process for the removal of native oxides, or other kind of residue, which typically occur oil the bottoms of contact openings etched into BPSG or other insulating layers on semiconductor substrates. The improved plasma etching and cleaning process using the gaseous mixture of the present invention provides minimal CD loss, reduces striations formed in the surrounding insulating layer, and improves opening uniformity.

The data of the present invention also confirms that the mixture of nitrogen fluoride ($NF_3$) and ammonia ($NH_3$) gases which are injected upstream into a microwave plasma source, with a small amount of oxygen ($O_2$), etches undoped oxides, such as thermally grown $SiO_2$, faster than doped oxides, such as BPSG, PSG or BSG. Although the results of the present invention have been illustrated with reference to thermally grown $SiO_2$ as the undoped oxide, the invention is also not limited to the use of thermally grown $SiO_2$ and other undoped oxides, such as $SiO_2$, CVD or PECVD oxides, such as TEOS, TEOS deposited $SiO_2$ or silane, may be also used.

The above description illustrates exemplary embodiments of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method for plasma etching a semiconductor substrate, comprising:
    introducing a gaseous mixture containing $NH_3$, $NF_3$ and $O_2$ into a plasma source chamber, said plasma source chamber being situated upstream of a plasma chamber containing a semiconductor substrate;
    generating a plasma of said gaseous mixture in said plasma source chamber;
    flowing said plasma downstream of said plasma source chamber, and into said plasma chamber; and
    contacting said substrate with said plasma.

2. The method of claim 1, wherein said step of contacting said substrate with said plasma further comprises etching said substrate with said gaseous mixture containing $NH_3$/$NF_3$/$O_2$, wherein the flow rate of $NH_3$ is in the range of 1000–4000 sccm, the flow rate of $NF_3$ is in the range of 25–200 sccm, and the flow rate of $O_2$ is in the range of 50–1000 sccm.

3. The method of claim 2, wherein said flow rate of $NF_3$ and said flow rate of $NH_3$ are in a ratio of about 1/40.

4. The method of claim 2, wherein said flow rate of $NF_3$, said flow rate of $NH_3$, and said flow rate of $O_2$ are in a ratio of about 1/40/2.

5. The method of claim 2, wherein said flow rate of $NH_3$ is of about 2000 sccm, the flow rate of $NF_3$ is of about 50 sccm, and the flow rate of $O_2$ is of about 100 sccm.

6. The method of claim 2, wherein said flow rate of $NH_3$ is of about 2000 sccm, the flow rate of $NF_3$ is of about 100 sccm, and the flow rate of $O_2$ is of about 100 sccm.

7. A method for cleaning a contact opening provided in an insulating layer formed over a substrate, said method comprising:
    placing said substrate and said insulating layer into a plasma chamber, said insulating layer having at least one contact opening therein;
    introducing a gaseous mixture containing $NH_3$, $NF_3$ and $O_2$ into a plasma source chamber, said plasma source chamber being situated upstream of said plasma chamber;
    generating a plasma of said gaseous mixture in said plasma source chamber;
    flowing said plasma downstream of said plasma source chamber into said plasma chamber; and
    contacting said insulating layer with said plasma to clean at least a bottom of said opening with said plasma.

8. The method of claim 7, wherein said step of contacting said insulating layer further comprises selectively etching said bottom of said opening.

9. The method of claim 7, wherein said step of contacting said insulating layer with said plasma further comprises selectively etching said bottom of said opening with said gaseous mixture containing $NH_3$, $NF_3$ and $O_2$, wherein the flow rate of $NH_3$ is in the range of 1000–4000 sccm, the flow rate of $NF_3$ is in the range of 25–200 sccm, and the flow rate of $O_2$ is in the range of 50–1000 sccm.

10. The method of claim 9, wherein said flow rate of $NF_3$ and said flow rate of $NH_3$ are in a ratio of about 1/40.

11. The method of claim 9, wherein said flow rate of $NF_3$, said flow rate of $NH_3$, aid said flow rate of $O_2$ are in a ratio of about 1/40/2.

12. The method of claim 9, wherein said flow rate of $NH_3$ is of about 2000 sccm, the flow rate of $NF_3$ is of about 50 sccm, and the flow rate of $O_2$ is of about 100 sccm.

13. The method of claim 9, wherein said flow rate of $NH_3$ is of about 2000 sccm, the flow rate of $NF_3$ is of about 100 sccm, and the flow rate of $O_2$ is of about 100 sccm.

14. A method for removing a native oxide formed inside of a contact opening provided within an insulating layer formed over a semiconductor substrate, said method comprising:
    introducing a gaseous mixture containing, $NH_3$, $NF_3$ and $O_2$ into a plasma source chamber, said plasma source chamber being situated upstream of a plasma chamber containing a semiconductor substrate;
    generating a plasma of said gaseous mixture into said plasma source chamber;
    flowing said plasma downstream of said plasma source chamber, and into said plasma chamber; and
    contacting said contact opening with said plasma to remove said native oxide from at least a bottom of said opening.

15. The method of claim 14, wherein said step of contacting said contact opening further comprises selectively etching of said native oxide with said plasma.

16. The method of claim 14, wherein said step of contacting said contact opening with said plasma further comprises selectively etching said native oxide with said gaseous mixture containing, $NH_3$, $NF_3$ and $O_2$, wherein die flow rate of $NH_3$ is in the range of 1000–4000 sccm, the flow rate of $NF_3$ is in the range of 25–200 sccm, and the flow rate of $O_2$ is in the range of 50–1000 sccm.

17. The method of claim 16, wherein said flow rate of $NF_3$ and said flow rate of $NH_3$ are in a ratio of about 1/40.

18. The method of claim 16, wherein said flow rate of $NF_3$, said flow rate of $NH_3$, and said flow rate of $O_2$ are in a ratio of about 1/40/2.

19. The method of claim 16, wherein said flow rate of $NH_3$ is of about 2000 sccm, the flow rate of $NF_3$ is of about 50 sccm, and the flow rate of $O_2$ is of about 100 sccm.

20. The method of claim 16, wherein said flow rate of $NH_3$ is of about 2000 sccm, the flow rate of $NF_3$ is of about 100 sccm, and the flow rate of $O_2$ is of about 100 sccm.

21. A method for etching an undoped oxide provided on a semiconductor substrate relative to a doped oxide provided on said semiconductor substrate, said method comprising:

introducing a gaseous mixture containing $NH_3$, $NF_3$ and $O_2$ into a plasma source chamber, said plasma source chamber being situated upstream of a plasma chamber containing said first and second semiconductor substrate;

generating a plasma of said gaseous mixture in said plasma source chamber;

flowing said plasma downstream of said plasma source chamber, and into said plasma chamber; and contacting said first and second semiconductor substrates with said plasma.

22. The method of claim 21, wherein said step of contacting said semiconductor substrate with said plasma further comprises etching said semiconductor substrate with said gaseous mixture containing $NH_3/NF_3/O_2$, wherein the flow rate of $NH_3$ is in the range of 1000–4000 sccm, the flow rate of $NF_3$ is in the range of 25–100 sccm, and the flow rate of $O_2$ is in the range of 50–1000 sccm.

23. The method of claim 22, wherein said flow rate of $NF_3$ and said flow rate of $NH_3$ are in a ratio of about 1/40.

24. The method of claim 22, wherein said flow rate of $NF_3$, said flow rate of $NH_3$, and said flow rate of $O_2$ are in a ratio of about 1/40/2.

25. The method of claim 22, wherein said flow rate of $NH_3$ is of about 2000 sccm, the flow, rate of $NF_3$ is of about 100 sccm, and the flow rate of $O_2$ is of about 100 sccm.

* * * * *